(12) United States Patent
Zhu et al.

(10) Patent No.: US 8,089,125 B2
(45) Date of Patent: Jan. 3, 2012

(54) INTEGRATED CIRCUIT SYSTEM WITH TRIODE

(75) Inventors: Jianhong Zhu, Austin, TX (US); Ruigang Li, Austin, TX (US); James F. Buller, Austin, TX (US); David Wu, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 25 days.

(21) Appl. No.: 11/759,454

(22) Filed: Jun. 7, 2007

(65) Prior Publication Data

US 2008/0303089 A1 Dec. 11, 2008

(51) Int. Cl.
*H01L 27/12* (2006.01)

(52) U.S. Cl. .. 257/347; 257/355; 257/774; 257/E27.112

(58) Field of Classification Search .................. 257/347, 257/355, 774, E27.112
See application file for complete search history.

(56) References Cited

U.S. PATENT DOCUMENTS

| | | | | |
|---|---|---|---|---|
| 4,954,456 | A | * | 9/1990 | Kim et al. ...................... 438/207 |
| 5,567,961 | A | * | 10/1996 | Usagawa et al. ............... 257/197 |
| 5,828,119 | A | | 10/1998 | Katsube |
| 5,955,764 | A | | 9/1999 | Katsube |
| 6,124,618 | A | * | 9/2000 | Wong et al. .................... 257/370 |
| 6,171,961 | B1 | * | 1/2001 | Yamazaki et al. ............. 438/688 |
| 6,278,159 | B1 | | 8/2001 | Patelmo et al. |
| 6,417,544 | B1 | | 7/2002 | Jun et al. |
| 6,551,892 | B2 | | 4/2003 | Patelmo et al. |
| 6,594,809 | B2 | | 7/2003 | Wang et al. |
| 2006/0071700 | A1 | * | 4/2006 | Meyer et al. .................. 327/512 |
| 2006/0125055 | A1 | * | 6/2006 | Menard ......................... 257/607 |

* cited by examiner

*Primary Examiner* — Tan N Tran
(74) *Attorney, Agent, or Firm* — Farjami & Farjami LLP

(57) ABSTRACT

An integrated circuit system includes an integrated circuit, forming a triode near the integrated circuit, and attaching a connector to the triode and the integrated circuit.

18 Claims, 4 Drawing Sheets

INTEGRATED CIRCUIT SYSTEM WITH TRIODE

TECHNICAL FIELD

The present invention relates generally to integrated circuit systems and more particularly to a system for an integrated circuit with MOS device.

BACKGROUND ART

Electronics devices, such as computer systems, music players, or cellular phones, rely on metal-oxide-semiconductor (MOS) for their key functions and features. Demands for more features and smaller sizes, result in decreasing MOS transistor sizes as well as the gate insulation or gate oxide becoming thinner. A thinner gate oxide or insulator in a MOS transistor results in exponential increases in stray current, such as leakage current, and forces opposing transistor switching, such as parasitic capacitances of the MOS device. Producing an integrated circuit (IC) has become increasingly difficult and unpredictable. Instead of producing more integrated circuit devices, these difficulties have resulted in fewer of the IC devices that meet performance or functions required.

Process-induced damage is also becoming a very serious concern for semiconductor device manufacturers. Such damage accounts for device degradations and lower yields. One type of process-induced damage is charge-induced damage. Charge-induced damage can occur during plasma etch and plasma-enhanced deposition processes often referred to as plasma charging damage, ash, and ion implantation. Charge-induced damage is becoming particularly serious due to the scaling down of gate oxide thicknesses and channel length with succeeding technologies, increasing levels of metallization, and the advent of high-density plasma sources for etching and deposition.

After assembling the thousands of unconnected cells for creating the IC, the interconnection of the cells can be achieved by a metallization process. Metallization includes the creation of a metal layer for interconnecting between the cells. A metal layer is made out of a conductive material such as metal according to a pattern specified to implement the particular IC function. In automated IC design, the metal layer pattern is created by routing that implements the specified IC function. The metal layer is processed according to the routed pattern. In the production of CMOS devices, plasma-etching techniques are used to produce the pattern on the metal layer. Metal layers are individually created and then connections are made between them as needed. This allows interconnections defined by pattern of the various metal layers to carry signals to and from cells in similar or different levels.

Interconnects in one metal layer may be connected to several gate inputs of MOS transistors before connections between the metal layer and other metal layers can be completed. Until the connections are completed, such gates remain open circuited and the interconnects that are attached to them behave as antennas. The antenna behaving interconnects receive static charge from the surrounding environment such as when a next higher metal layer is plasma-etched. Charges that accumulate in a gate capacitor can cause a gate-to-source voltage to exceed a breakdown voltage. An accumulation of charges on an open-circuited gate may result in a large enough charge to punch through the dielectric gate oxide. Since a gate oxide is extremely thin, it may easily be damaged by the excessive voltage. This effect is magnified as the length of interconnects increases.

As the density of MOS devices in IC increases, the structure of MOS devices gets smaller and, in turn, their respective gate oxide layers become even thinner. Moreover, to achieve higher performance and reduce power consumption, MOS devices, particularly CMOS devices, have been operating under lower supply voltage conditions and with smaller gate sizes. Hence, the accumulation of charges due to the antenna behavior of the interconnections becomes more critical. To prevent the accumulation of static charge in the gate capacitor of MOS devices, gate protection is usually included at the gate input of the MOS devices. The protection mechanism invariably makes use of clamping or antenna diodes often collectively referred to as antenna diodes. The function of the gate input protection is to limit the gate input voltage and prevent breakdown of the gate.

With respect to charge-induced damage, the charge collected in the antenna stresses the oxide of a device. More specifically, in a MOS device, the charge collected on the antenna stresses the gate oxide of the MOS device, thereby inducing stress-related degradation of the MOS device. This stress-related degradation may include shortening the lifetime of the device, increasing the gate leakage of the device, shifting the threshold voltage of the device, or rendering the device inoperable.

Thus, a need still remains for an integrated circuit system to improve integrated circuit modeling, performance, and size. In view of the ever-increasing commercial competitive pressures, coupled with the technical imperatives of improved die-to-die variation and improved production efficiency, it is critical that answers be found for these problems. Competitive pressures also demand lower costs alongside improved efficiencies and performance.

Solutions to these problems have been sought but prior developments have eluded those skilled in the art.

DISCLOSURE OF THE INVENTION

The present invention provides an integrated circuit, forming a triode near the integrated circuit, and attaching a connector to the triode and the integrated circuit.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
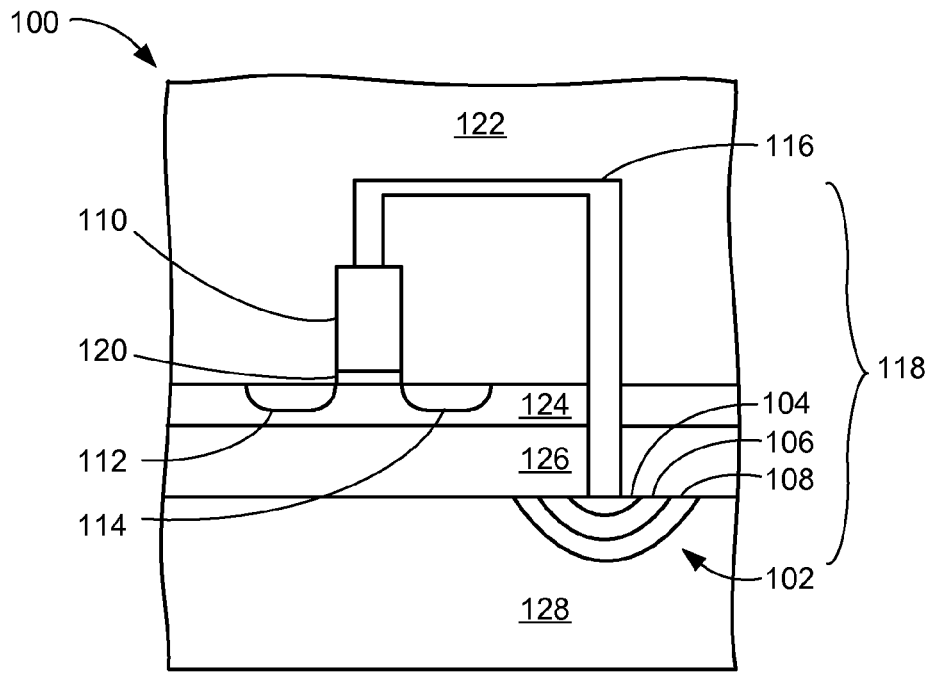
FIG. 1 is a cross-sectional view of an integrated circuit system along the line segment 1-1 of FIG. 2 in an embodiment of the present invention.

The following embodiments are described in sufficient detail to enable those skilled in the art to make and use the invention. It is to be understood that other embodiments would be evident based on the present disclosure, and that system, process, numerical, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, mathematics, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Figure 2:
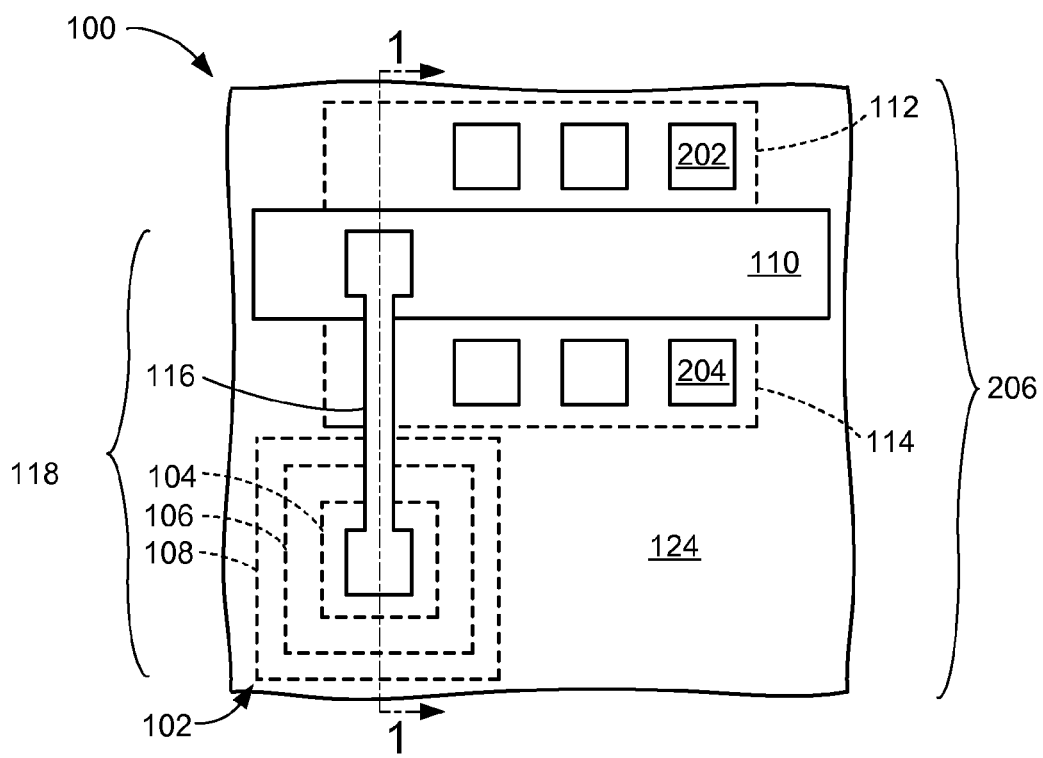
FIG. 2 is a top plan view of the integrated circuit system.

Referring now to FIG. 1, therein is shown a cross-sectional view of an integrated circuit system 100 along the line segment 1-1 of FIG. 2 in an embodiment of the present invention. The integrated circuit system 100 includes a triode 102 having a first node 104, a second node 106, and a third node 108. The integrated circuit system 100 also preferably includes a gate 110, a source 112, and a drain 114. The gate 110 can preferably be connected to the triode with a connector 116 such as a conductor including metal. The connector 116 having an electrical path to the triode 102 preferably forms a lightning rod 118 for suppressing charging and arcing resulting from wafer processing. The connector 116 can be formed by several processes such as deposition or etching, and can have any form such as an interconnection or a contact.

The connector 116 and the gate 110 can be electrically isolated in wafer processing prior to complete connection of the integrated circuit. Electrical isolation can result in accumulation of an electrical charge such as a static charge from etching. A gate insulator 120 can be damaged by charging and arcing resulting from the electrical charge accumulated by electrical isolation. The gate insulator 120 can preferably be formed as a thin oxide resulting in susceptibility to damage.

The lightning rod 118 having the triode 102 can preferably provide an electrical path through a dielectric 122 for the electrical charge thereby suppressing charging and arcing from electrical isolation of the connector 116 and the gate 110. Redirecting the electrical charge particularly a static charge can be characterized in a similar manner to redirecting lightning.

The source 112 and the drain 114 can optionally be formed in a first substrate 124 over an insulator 126 such as buried oxide. The insulator 126 can preferably be formed over a second substrate 128 with the triode 102 providing electrical isolation for the second substrate 128, the triode 102, the source 112, and the drain 114. The first substrate 124 and the second substrate 128 can be formed of the same or different material. For example, the triode 102 can be formed as a P—N—P structure. Further, for example, the third node 108 can be preferably formed with a P+ dopant in the second substrate 128, the second node 106 can be preferably formed with an N+ dopant in the third node 108, and the first node 104 can be preferably formed with a P+ dopant in the second node 106. The triode 102 suppresses leakage of integrated circuits in both directions, such as forward biased and reverse biased, under normal operating conditions.

It has been discovered that the integrated circuit system 100 having the triode 102 and the connector 116 forming the lightning rod 118 suppresses charging and arcing resulting from processing as well as suppressing leakage of the integrated circuits in both directions under normal operating conditions.

Referring now to FIG. 2, therein is shown a top plan view of the integrated circuit system 100. The integrated circuit system 100 includes the triode 102 having the first node 104 over the second node 106, the second node 106 over the third node 108, and the third node 108 in the first substrate 124. The integrated circuit system 100 can also include the gate 110, the source 112, and the drain 114. The connector 116 can connect a contact over the first node 104 and a contact over the gate 110. The source 112 can preferably include a source contact 202 for electrically connecting the source 112 to an electrical potential. Similarly, the drain 114 can preferably include a drain contact 204 for electrically connecting the drain 114 to another device. The dielectric 122 is removed for clarity.

The lightning rod 118 including the connector 116 and the triode 102 connected to the gate 110 can provide redirection of the wafer processing electrical charges away from the gate 110 as well as suppress leakage. For illustrative purposes the triode 102 is formed adjacent the drain 114 although it is understood that the triode 102 may be formed in any location. Further, for illustrative purposes, the connector 116 is shown connected to the gate 110 between the source 112 and the drain 114 although it is understood that the connector 116 may be connected at any location. Yet further, for illustrative purposes a portion of an integrated circuit 206 is shown although it is understood that the integrated circuit 206 can include any number of the gate 110, the source 112, the drain 114, or the connector 116.

Figure 3:
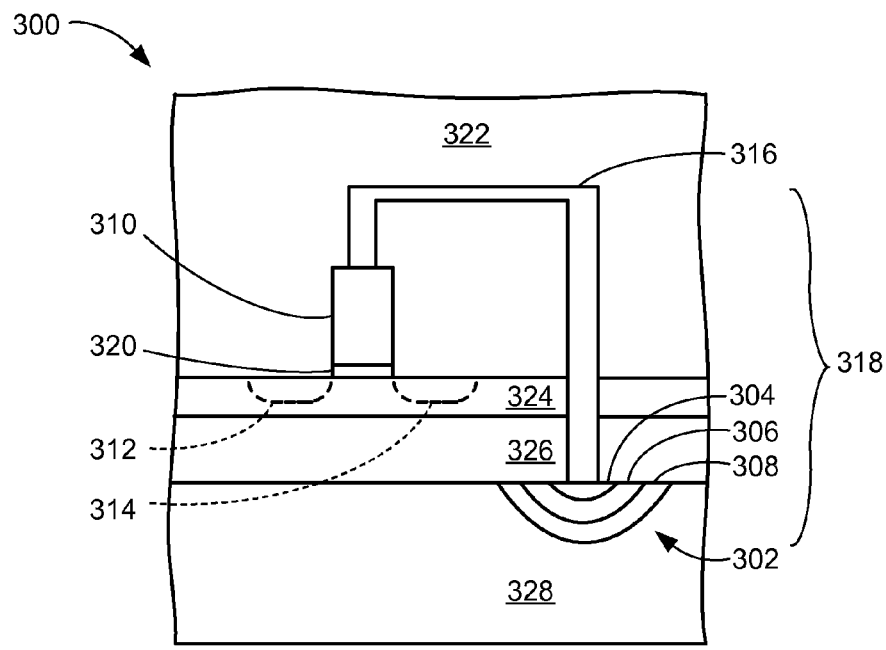
FIG. 3 is a cross-sectional view of an integrated circuit system along the line segment 3-3 of FIG. 4 in another embodiment of the present invention.
Figure 4:
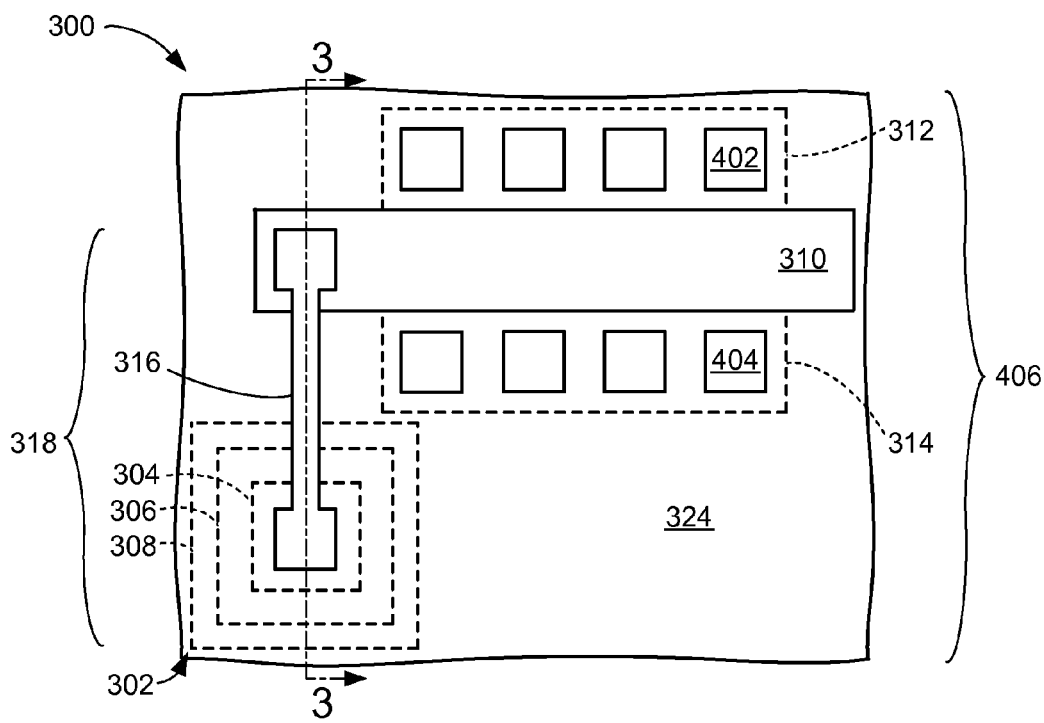
FIG. 4 is a top plan view of the integrated circuit system.

Referring now to FIG. 3, therein is shown a cross-sectional view of an integrated circuit system 300 along the line segment 3-3 of FIG. 4 in another embodiment of the present invention. In a manner similar to the integrated circuit system 100 of FIG. 1, the integrated circuit system 300 includes a triode 302 having a first node 304, a second node 306, and a third node 308. The integrated circuit system 300 also preferably includes a gate 310, a source 312, and a drain 314. The gate 310 can preferably be connected to the triode with a connector 316 such as a conductor including metal. The connector 316 having an electrical path to the triode 302 preferably forms a lightning rod 318 for suppressing charging and arcing resulting from wafer processing. The connector 316 can be formed by several processes such as deposition or etching, and can have any form such as an interconnection or a contact.

The connector 316 and the gate 310 can be electrically isolated in wafer processing prior to complete connection of the integrated circuit. Electrical isolation can result in accumulation of an electrical charge such as a static charge from etching. A gate insulator 320 can be damaged by charging and arcing resulting from the electrical charge accumulated by electrical isolation. The gate insulator 320 can preferably be formed as a thin oxide resulting in susceptibility to damage. The lightning rod 318 having the triode 302 can preferably provide an electrical path through a dielectric 322 for the electrical charge thereby suppressing charging and arcing from electrical isolation of the connector 316 and the gate 310. Redirecting the electrical charge particularly a static charge can be characterized in a similar manner to redirecting lightning.

The source 312 and the drain 314 can optionally be formed in a first substrate 324 over an insulator 326 such as buried oxide. The insulator 326 can preferably be formed over a second substrate 328 with the triode 302 providing electrical isolation for the second substrate 328, the triode 302, the source 312, and the drain 314. The first substrate 324 and the second substrate 328 can be formed of the same or different material. For example, the triode 302 can be formed as a P—N—P structure. Further, for example, the third node 308 can be preferably formed with a P+ dopant in the second substrate 328, the second node 306 can be preferably formed with an N+ dopant in the third node 308, and the first node 304 can be preferably formed with a P+ dopant in the second node 306. The triode 302 suppresses leakage in both directions, such as forward biased and reverse biased, under normal operating conditions.

Referring now to FIG. 4, therein is shown a top plan view of the integrated circuit system 300. The integrated circuit system 300 includes the triode 302 having the first node 304 over the second node 306, the second node 306 over the third node 308, and the third node 308 in the first substrate 324. The integrated circuit system 300 also includes the gate 310, the source 312, and the drain 314. The connector 316 can connect a contact over the first node 304 and a contact over the gate 310. The source 312 can preferably include a source contact 402 for electrically connecting the source 312 to an electrical potential. Similarly, the drain 314 can preferably include a drain contact 404 for electrically connecting the drain 314 to another device. The dielectric 322 is removed for clarity.

The lightning rod 318 including the connector 316 and the triode 302 connected to the gate 310 can provide redirection of the wafer processing electrical charges away from the gate 310 as well as suppress leakage. For illustrative purposes the triode 302 is formed adjacent the drain 314 although it is understood that the triode 302 may be formed in any location. Further, for illustrative purposes, the connector 316 is shown connected to the gate 310 adjacent the source 312 and the drain 314 although it is understood that the connector 316 may be connected at any location. Yet further, for illustrative purposes a portion of an integrated circuit 406 is shown although it is understood that the integrated circuit 406 can include any number of the gate 310, the source 312, the drain 314, or the connector 316.

Figure 5:
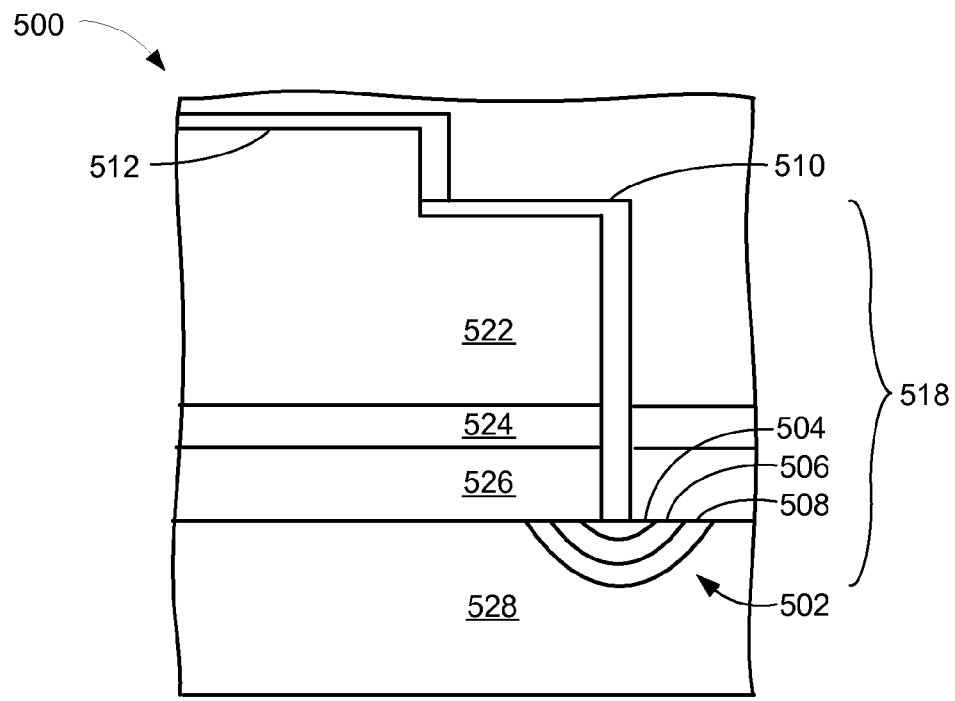
FIG. 5 is a cross-sectional view of an integrated circuit system along the line segment 5-5 of FIG. 6 in yet another embodiment of the present invention.
Figure 6:
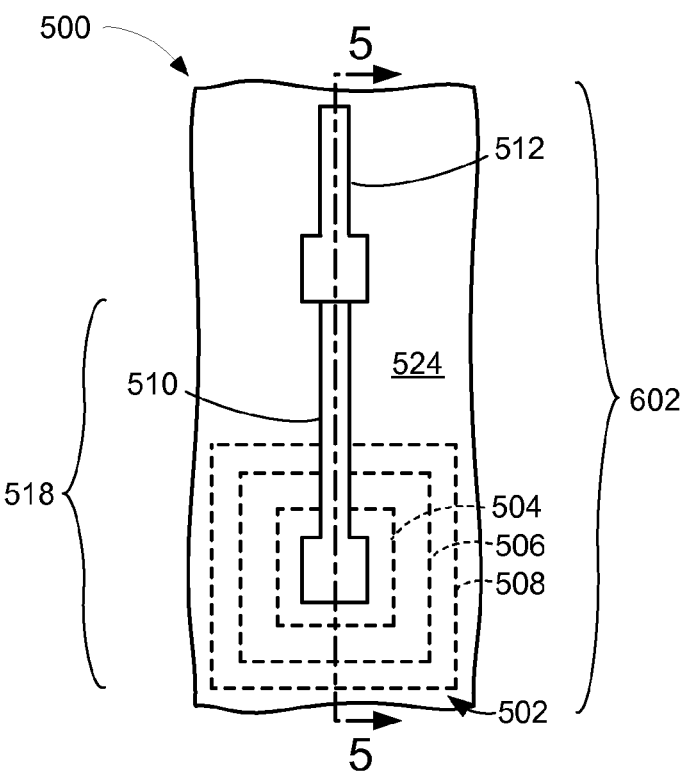
FIG. 6 is a top plan view of the integrated circuit system.

Referring now to FIG. 5, therein is shown a cross-sectional view of an integrated circuit system 500 along the line segment 5-5 of FIG. 6 in yet another embodiment of the present invention. The integrated circuit system 500 includes a triode 502 having a first node 504, a second node 506, and a third node 508. The integrated circuit system 500 also preferably includes a first connector 510 such as a conductor including metal and a second connector 512 such as a conductor including metal. The first connector 510 having an electrical path to the triode 502 preferably forms a lightning rod 518 for suppressing charging and arcing resulting from wafer processing.

The first connector 510 can be electrically isolated during wafer processing prior to complete connection of the integrated circuits. Electrical isolation can result in accumulation of an electrical charge such as a static charge from etching. Charging and arcing from the electrical charge accumulated by electrical isolation can result in damage to the integrated circuit system 500. The triode 502 can preferably provide an electrical path through a dielectric 522 and a first substrate 524 for the electrical charge thereby suppressing charging and arcing from electrical isolation of the first connector 510. Redirecting the electrical charge particularly a static charge can be characterized in a similar manner to redirecting lightning.

An insulator 526 such as a buried oxide can optionally be formed under the first substrate 524 providing electrical isolation for the first substrate 524, a second substrate 528, or the triode 502. The first substrate 524 and the second substrate 528 can be formed of the same or different material. For example, in a manner similar to the triode 102 of FIG. 1 and the triode 302 of FIG. 3, the triode 502 can be formed in the second substrate 528 to provide an electrical path for the first connector 510 for suppressing charging and arcing of the electrical charge. Further, for example, the third node 508 can be preferably formed with a P+ dopant in the second substrate 528, the second node 506 can be preferably formed with an N+ dopant in the third node 508, and the first node 504 can be preferably formed with a P+ dopant in the second node 506.

Referring now to FIG. 6 therein is shown a top plan view of the integrated circuit system 500. The integrated circuit system 500 includes the triode 502 having the first node 504 over the second node 506, the second node 506 over the third node 508, and the third node 508 in the first substrate 524. The integrated circuit system 500 can also includes the first connector 510 preferably connecting a contact over the first node 504 and a contact over the first connector 510. The dielectric 522 is removed for clarity.

The lightning rod 518 including the first connector 510 and the triode 502 can provide redirection of the wafer processing electrical charges away from the first connector 510 including integrated circuits connected to the first connector 510. Further, the lightning rod 518 can suppress leakage of the integrated circuits in both directions during normal operating conditions. For illustrative purposes, a portion of an integrated circuit 602 is shown although it is understood that the integrated circuit 602 can include any number of the first connector 510 or the second connector 512.

Figures 7A, 7B, 7C:
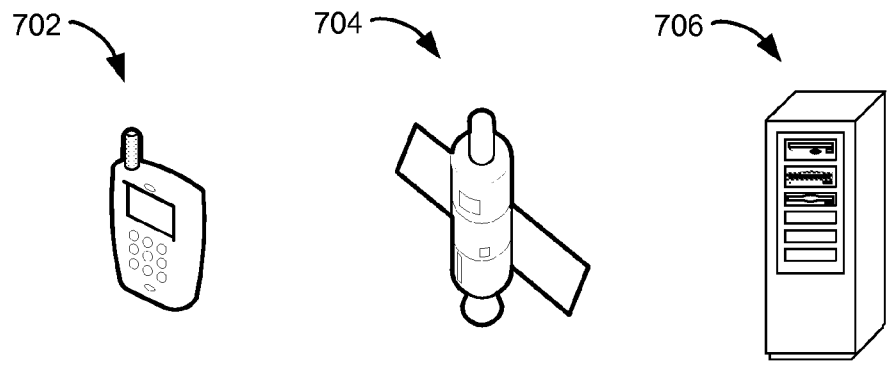
FIGS. 7A, 7B, and 7C are schematic views of electronics systems as examples in which various aspects of the present invention can be implemented.

Referring now to FIGS. 7A, 7B, and 7C therein are shown schematic views of electronics systems as examples in which various aspects of the present invention can be implemented. The present invention can provide significant improvement for the electronic systems. The electronics systems can be any system performing any function including managing data: creation, transportation, transmittal, modification, storage, or combination thereof. Any of the electronics systems can include one or more subsystems. The subsystems can provide the present invention implemented with printed circuit boards, substrates, or included with other electronic assemblies.

As examples, the electronics systems such as a cellular phone 702, a satellite 704, and a computer system 706 can have data management subsystems including an implementation of the present invention. For example, information created, transported, or stored on the cellular phone 702 can be transmitted to the satellite 704. Similarly, the satellite 704 can transmit or modify the information and transmit or receive data to or from the computer system 706. The computer system 706 can store or modify information that can optionally be transmitted to other systems, such as the cellular phone 702 or the satellite 704.

Figure 8:
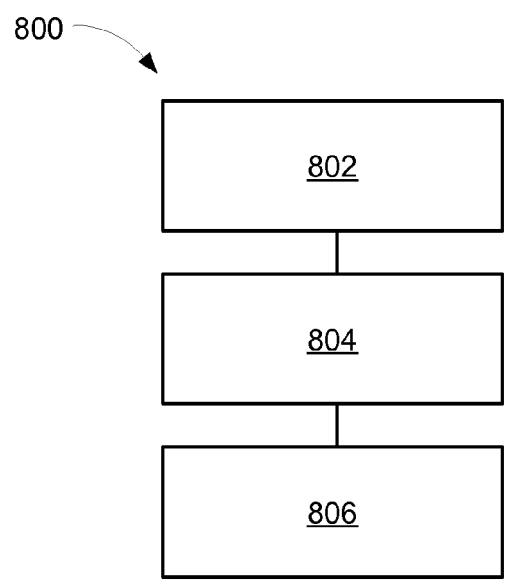
FIG. 8 is a flow chart of an integrated circuit system for manufacturing the integrated circuit system in an embodiment of the present invention.

Referring now to FIG. 8, therein is shown a flow chart of an integrated circuit system 800 for manufacturing the integrated circuit system 100 in an embodiment of the present invention. The system 800 includes providing an integrated circuit in a block 802; forming a triode near the integrated circuit in a block 804; and attaching a connector to the triode and the integrated circuit in a block 806.

In greater detail, a system to provide the method and apparatus of the integrated circuit system 100, in an embodiment of the present invention, is performed as follows:
1. Providing an integrated circuit having a first substrate and a second substrate.
2. Forming a triode having a first node over a second node, the second node over a third node, and the third node in the second substrate near the integrated circuit.
3. Forming a lightning rod including a connector over the first substrate and the triode in the second substrate.

The present invention thus has numerous aspects of different embodiments. These and other valuable aspects of different embodiments of the present invention consequently further the state of the technology.

Thus, it has been discovered that the integrated circuit system method and apparatus of the present invention furnish important and heretofore unknown and unavailable solutions, capabilities, and functional aspects for integrated circuit systems. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method comprising:
  providing an integrated circuit including a gate;
  forming a triode near the integrated circuit, wherein forming the triode includes forming a first node over a second node, the second node over a third node, and the third node in a substrate; and
  attaching a connector to the triode and the integrated circuit, the connector connecting the triode to the gate, the triode being electrically coupled to the integrated circuit only by the connector.

2. The method as claimed in claim 1 wherein attaching the connector includes attaching the connector to the triode and over the gate between a source and a drain of the integrated circuit.

3. The method as claimed in claim 1 wherein attaching the connector includes attaching the connector to the triode and over the gate adjacent to a source and a drain of the integrated circuit.

4. The method as claimed in claim 1 further comprising forming an electronic system or a subsystem with the triode, the connector, or the integrated circuit.

5. A method comprising:
  providing an integrated circuit having a gate, a first substrate, and a second substrate;
  forming a triode having a first node over a second node, the second node over a third node, and the third node in the second substrate near the integrated circuit; and
  forming a lightning rod including a connector over the first substrate and the triode in the second substrate, the connector connecting the triode to the gate.

6. The method as claimed in claim 5 wherein forming the triode includes implanting dopants forming the first node over the second node, the second node over the third node, and the third node in the second substrate.

7. The method as claimed in claim 5 wherein forming the triode includes forming a P-N-P or an N-P-N structure for dissipating an electrical charge and suppressing leakage.

8. The method as claimed in claim 5 wherein forming the lightning rod includes forming the connector through a dielectric over the first substrate.

9. The method as claimed in claim 5 further comprising forming a buried oxide under the first substrate and over the triode and the second substrate.

10. An integrated circuit system comprising:
  an integrated circuit including a gate;
  a triode near the integrated circuit, wherein the triode includes a first node over a second node, the second node over a third node, and the third node in a substrate; and
  a connector attached to the triode and the integrated circuit, the connector connecting the triode to the gate, the triode being electrically coupled to the integrated circuit only by the connector.

11. The system as claimed in claim 10 wherein the connector is attached to the triode and over the gate between a source and a drain of the integrated circuit.

12. The system as claimed in claim 10 wherein the connector is attached to the triode and over the gate adjacent to a source and a drain of the integrated circuit.

13. The system as claimed in claim 10 further comprising forming an electronic system or subsystem with the integrated circuit system.

14. The system as claimed in claim 10 further comprising:
  a first substrate and a second substrate;
  the triode has a first node over a second node, the second node over a third node, and the third node in the second substrate near the integrated circuit; and
  the connector is the connector of a lightning rod including the connector over the first substrate and the triode in the second substrate.

15. The system as claimed in claim 14 wherein the triode includes dopants forming the first node over the second node, the second node over the third node, and the third node in the second substrate.

16. The system as claimed in claim 14 wherein the triode is a P-N-P or an N-P-N structure for dissipating an electrical charge and suppressing leakage.

17. The system as claimed in claim 14 wherein the lightning rod includes the connector through a dielectric over the first substrate.

18. The system as claimed in claim 14 further comprising a buried oxide under the first substrate and over the triode and the second substrate.

* * * * *